US009053767B2

(12) United States Patent
Cha

(10) Patent No.: US 9,053,767 B2
(45) Date of Patent: Jun. 9, 2015

(54) SEMICONDUCTOR MEMORY DEVICE AND METHOD OF OPERATING THE SAME

(75) Inventor: Jae Won Cha, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 200 days.

(21) Appl. No.: 13/599,931

(22) Filed: Aug. 30, 2012

(65) Prior Publication Data

US 2013/0163332 A1    Jun. 27, 2013

(30) Foreign Application Priority Data

Dec. 21, 2011    (KR) .................... 10-2011-0139045

(51) Int. Cl.

| G11C 7/10 | (2006.01) |
|---|---|
| G06F 12/02 | (2006.01) |
| G11C 16/10 | (2006.01) |
| G11C 16/04 | (2006.01) |
| G11C 16/06 | (2006.01) |
| G11C 16/34 | (2006.01) |
| G11C 7/02 | (2006.01) |

(52) U.S. Cl.
CPC .......... G11C 7/1012 (2013.01); G06F 12/0246 (2013.01); G11C 7/1006 (2013.01); G11C 16/10 (2013.01); G11C 16/0483 (2013.01); G11C 16/06 (2013.01); G11C 16/3418 (2013.01); G11C 7/02 (2013.01)

(58) Field of Classification Search
CPC ........ G11C 7/24; G11C 8/20; G11C 11/5628; G11C 11/5642; G11C 11/5621; G11C 16/22; G11C 16/10; G11C 11/16; G11C 11/15; G11C 7/1012; G11C 7/02; G11C 16/3418; G11C 16/0483; G11C 16/06; G06F 21/79; G06F 21/78; G06F 21/1408; G06F 21/72; H01L 43/08; H01L 27/228

USPC .......... 365/185.02, 185.12, 185.04; 714/807, 714/708; 713/193
See application file for complete search history.

(56) References Cited

U.S. PATENT DOCUMENTS

| 2003/0135798 | A1* | 7/2003 | Katayama et al. ............ 714/710 |
|---|---|---|---|
| 2008/0065813 | A1* | 3/2008 | Li et al. ......................... 711/103 |
| 2009/0225597 | A1* | 9/2009 | Shin et al. ................. 365/185.05 |
| 2009/0323942 | A1* | 12/2009 | Sharon et al. .................... 380/44 |
| 2010/0070682 | A1* | 3/2010 | Wan et al. ..................... 711/103 |
| 2010/0259983 | A1* | 10/2010 | Yoon ........................ 365/185.12 |
| 2012/0008425 | A1* | 1/2012 | Park ......................... 365/189.05 |

FOREIGN PATENT DOCUMENTS

KR        1020100111990        10/2010

OTHER PUBLICATIONS

Preliminary Rejection issued by the Korean Intellectual Property Office on Nov. 28, 2012.

* cited by examiner

*Primary Examiner* — Richard Elms
*Assistant Examiner* — Ajay Ojha
(74) *Attorney, Agent, or Firm* — IP&T Group LLP

(57) ABSTRACT

A semiconductor memory device includes memory blocks including pages connected to plural main cells, a spare block, including pages connected to spare cells, configured to store a random seed for randomization to the spare cells connected to each page, page buffers configured to scramble data inputted for program operation by using random seed read from a page of the spare block selected by a control signal to transmit the scrambled data to the bit line, and configured to descramble data read from a main cell selected for read operation and output the descrambled data, and a controller configured to output the control signal to select a page of the spare block corresponding to an address of a page of the memory block selected for the programming or reading, and configured to control a scramble operation and a descramble operation of the page buffers.

14 Claims, 9 Drawing Sheets

SEMICONDUCTOR MEMORY DEVICE AND METHOD OF OPERATING THE SAME

CROSS-REFERENCE TO RELATED APPLICATION

This application claims priority from Korean Patent Application No. 10-2011-0139045, filed on Dec. 21, 2011, the contents of which are incorporated herein by reference in its entirety.

BACKGROUND

The present invention relates to a semiconductor memory device and a method of operating the same.

A memory cell in a semiconductor memory cell is programmed or erased through F-N tunneling. Electrons are charged in a floating gate according to a program operation, and the electrons charged in the floating gate are discharged to a substrate in accordance with on an erase operation. A threshold voltage of a memory cell depends on amount of the electrons charged in the floating gate. Data is determined according to level of a threshold voltage detected in a read operation.

To increase capacity of data stored in the semiconductor memory device, a memory cell includes a multi level cell storable data with multi levels corresponding to 2-bit or more information, unlike a common memory device. The semiconductor memory device may store data having various states by varying magnitude of the threshold voltage through adjusting the amount of the electrons charged in the floating gate of the multi level cell. Since a program method of the multi level cell increases innovatively capacity of a non-volatile memory cell, it has been widely used. In the program method of the multi level cell, two or more logical page data are programmed in one physical page.

However, according as plural logical pages are programmed in one physical page, period of time needed for the program operation increases and a program operation becomes complicate. Additionally, since width of threshold voltage distributions becomes narrow according as the number of target threshold voltage of memory cells augments, read margin may reduce, so it is difficult to read data. Also, interference phenomenon may occur between adjoining memory cells in the program operation.

SUMMARY OF THE INVENTION

Exemplary embodiments of the present invention provide a semiconductor memory cell for enabling to reduce interference phenomenon by making uniform threshold voltage distributions of a memory cell through randomizing data to be stored in the memory cell.

A semiconductor memory device according to one embodiment of the present invention includes memory blocks including pages connected to plural main cells; a spare block, including pages connected to spare cells, configured to store a random seed for randomization to the spare cells connected to each page; page buffers, each connected to each of bit lines connected to the spare cell and the main cells, configured to scramble data inputted for program operation by using random seed read from a page of the spare block selected by a control signal to transmit the scrambled data to the bit line, and configured to descramble data read from a main cell selected for read operation and output the descrambled data; and a controller configured to output the control signal to select a page of the spare block corresponding to an address of a page of the memory block selected for the programming or reading, and configured to control a scramble operation and a descramble operation of the page buffers.

A semiconductor memory device according to another embodiment of the present invention includes a memory block where memory cells connected to word lines are divided into physical pages, and each of the physical phases are divided into a first logical page and a second logical page; a first spare block configured to have physical pages connected to first spare cells, each of the physical pages storing a random seed for randomization of data corresponding to each of the first logical pages of the memory block; a second spare block configured to have physical pages connected to second spare cells, each of the physical pages storing a random seed for randomization of data corresponding to each of the second logical pages of the memory block; page buffers connected to the first and the second spare cells and each of bit lines connected to main cell, configured to scramble data inputted for program operation by using the random seed read from the physical page of the first spare block and the second spare block and program the scrambled data to the main cell, and configured to descramble data read from the main cell by using the random seed and output the descrambled data for read operation; and a controller configured to control the control signal for selecting the physical page of the first or the second spare block corresponding to an address of a page selected for one of the program operation and the read operation, and control the scramble operation and the descramble operation of the page buffers.

A semiconductor memory device according to still another embodiment of the present invention includes memory blocks including pages connected to plural main cells; a random generator configured to output a random seed according to an address for data scramble for program operation and data descramble for read operation; page buffers connected to each of bit lines connected to the main cells, configured to scramble data inputted for the program operation by using a random seed inputted from the random generator and transmit the scrambled data to the bit line, and configured to descramble data read through the bit line by using the random seed and output the descrambled data in the read operation; and a controller configured to control the random generator to generate the random seed according to an address of a page selected for the program and read operations, and control the page buffer to scramble data to be programmed by using the random seed and descramble read data.

A method of operating a semiconductor memory device according to one embodiment of the present invention includes storing first data inputted for programming in a first latch of a page buffer; storing a random seed for randomization of data in a second latch of the page buffer; scrambling data using the first data stored in the first latch and the random seed stored in the second latch to store the scrambled data in the second latch; and programming the scrambled data stored in the second latch to a memory cell connected to a page selected for the programming.

A method of operating a semiconductor memory device according to another embodiment of the present invention includes storing a random seed for randomization of data in a first latch of a page buffer; reading data stored in a memory cell connected to selected page and storing the read data in a second latch of the page buffer; and descrambling data using the random seed stored in the first latch and the read data stored in the second latch to output the descrambled data.

A method of operating a semiconductor memory device according to still another embodiment of the present invention includes storing first data inputted for programming in a first latch of a page buffer; storing a random seed for randomization of data generated according to address in a second latch of the page buffer; scrambling data using the first data stored in the first latch and the random seed stored in the second latch, and storing the scrambled data in the second latch; and programming the scrambled data stored in the second latch to a memory cell connected to a page selected for the programming.

A method of operating a semiconductor memory device according to still another embodiment of the present invention includes receiving a random seed for randomization of data generated according to address, and storing the received random seed in a first latch of a page buffer; reading data stored in a memory cell connected to a page selected for reading of data and storing the read data in a second latch of the page buffer; and descrambling data using the random seed stored in the first latch and the read data stored in the second latch, and outputting the descrambled data.

A semiconductor memory device and a method of operating the same of the present invention randomize data to be stored in a memory cell without a circuit for data randomization, thereby reducing area of the semiconductor memory device by an area occupied by the circuit. In addition, the semiconductor memory device and the method may enhance reliability of data by making uniformly threshold voltage distributions of memory cells.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF SPECIFIC EMBODIMENTS

Hereinafter, the preferred embodiments of the present invention will be explained in more detail with reference to the accompanying drawings. Although embodiments have been described with reference to a number of illustrative embodiments thereof, it should be understood that numerous other modifications and embodiments can be devised by those skilled in the art that will fall within the spirit and scope of the principles of this disclosure.

Figure 1:
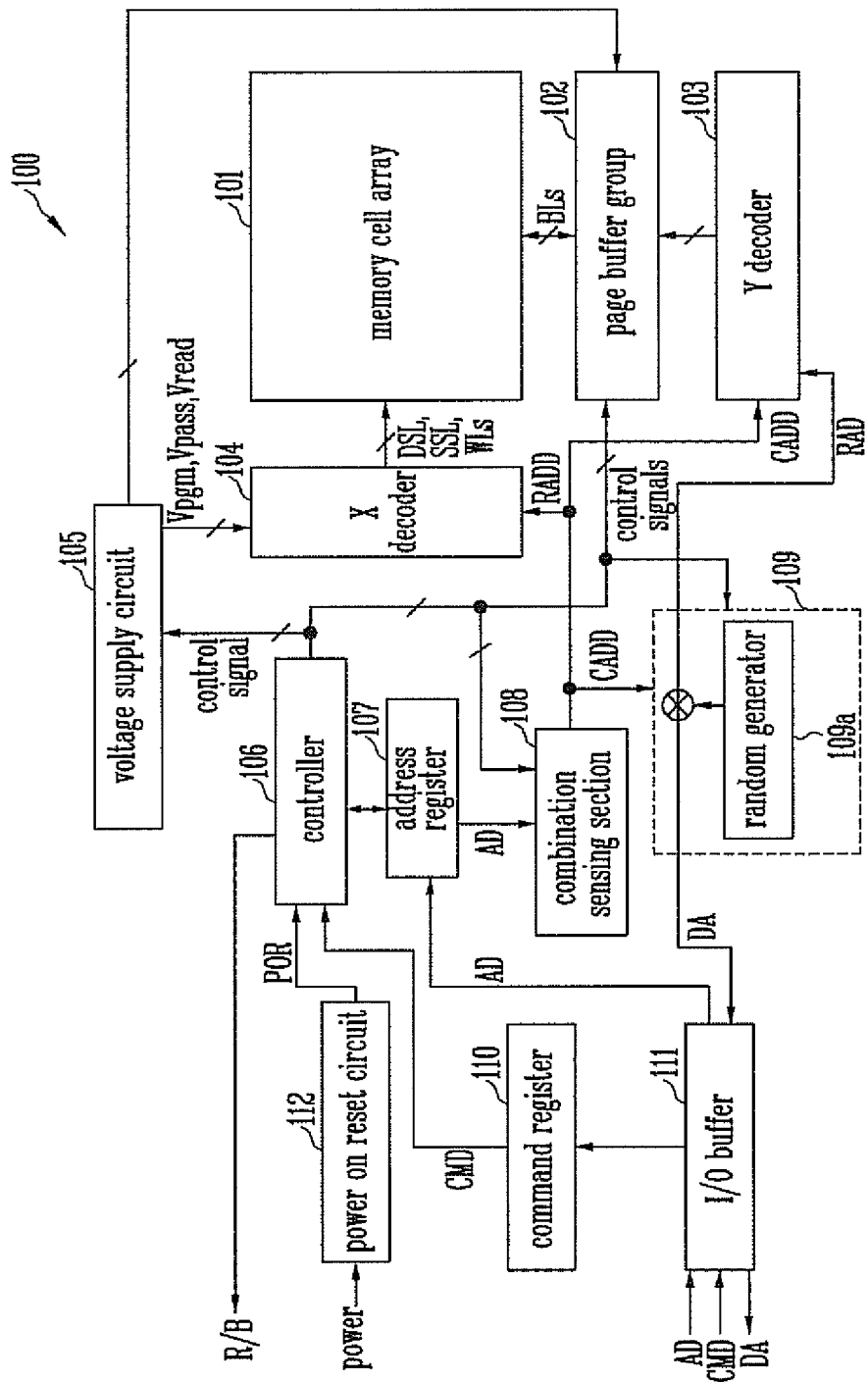
FIG. 1 is a block diagram illustrating a semiconductor memory device.

FIG. 1 is a block diagram illustrating a semiconductor memory device.

In FIG. 1, a memory cell array 101 of a semiconductor memory device 100 includes a plurality of memory blocks. Each of the memory blocks has memory cells connected respectively to word lines WLs and bit lines BLs.

The semiconductor memory device 100 includes operation circuit groups 102 to 105 and 107 to 112 for programming the memory cells included in the memory cell array 101 or reading data from the memory cells and a controller 106 for controlling the operation circuit groups 102 to 105 and 107 to 112.

The operation circuit group includes a page buffer group 102, a Y decoder 103, an X decoder 104, a voltage supply circuit 105, an address register 107, a combination sensing section 108, a randomizing section 109, a command register 110, an I/O buffer 111, and a power on reset circuit 112.

In case that a supply voltage starts to be applied to the semiconductor memory device 100, the power on reset circuit 112 detects whether or not the applied supply voltage increases up to a constant voltage level. The power on reset circuit 112 outputs a power on reset signal POR when the supply voltage increases to the constant voltage level. As a result, the controller 106 performs an initialization operation.

The controller 106 outputs a read/busy signal R/13 while a program operation, a read operation, an erase operation, or the like is performed.

An address AD, a command signal CMD, and a data DA are inputted to the I/O buffer 111 from outside.

The I/O buffer 111 delivers the inputted command signal CMD to the command register 110. The delivered command signal CMD is stored temporarily in the command register 110. Additionally, the I/O buffer 111 transmits the inputted address AD to the address register 107. The transmitted address AD is stored temporarily in the address register 107.

The controller 106 performs operation control using the command signal CMD stored temporarily in the command register 110. The address AD stored temporarily in the address register 107 is delivered to the combination sensing section 108. The combination sensing section 108 divides the address AD stored temporarily in the address register 107 into a column address CADD and a row address RADD.

The combination sensing section 108 transmits the column address CADD to the randomizing section 109 and the Y decoder 103. The combination sensing section 108 provides the row address RADD to the X decoder 104.

The I/O buffer 111 transmits the inputted data DA to the randomizing section 109. The randomizing section 109 generates random seed according to the column address CADD and the row address RADD transmitted from the combination sensing section 108. The randomizing section 109 converts the data DA transmitted from the I/O buffer 111 into a random data RAD by using the random seed to transmit the random data RAD to the Y decoder 103.

The Y decoder 103 transmits the random data RAD delivered from the randomizing section 109 to the page buffer group 102 in accordance with the column address CADD.

The randomizing section 109 for converting the data DA into the random data RAD includes a random generator 109a.

The random generator 109a generates the random seed according to the column address CADD and the row address RADD delivered from the combination sensing section 108. The random data RAD is generated by performing XOR operation about the random seed and the inputted data DA.

The random data RAD means data programmed in the memory cell.

Accordingly, the data read from the memory cell is non-randomized by the randomizing section 109 to be changed back into original data to be programmed. The changed data is outputted.

The controller 106 outputs internally control signals in response to the command signal CMD stored temporarily in the command register 110.

The control signals outputted from the controller 106 includes voltage control signals for controlling operation of the voltage supply circuit 105 and page buffer control signals for controlling operation of the page buffer group 102. The control signals outputted from the controller 106 has also signals for controlling the randomizing section 109 and the combination sensing section 108.

The voltage supply circuit 105 provides operation voltages, e.g., Vpgm, Vpass, Vread, and etc., for programming, reading, or erasing the memory cells to the X decoder 104 through global lines, according to the control signals transmitted from the controller 106.

The X decoder 104 selects one of the memory blocks of the memory cell array 101 in response to the row address RADD transmitted from the combination sensing section 108. to connect word lines WLs of the selected memory block to the global lines.

The page buffer group 102 includes page buffers connected to the bit lines BLs, respectively. The page buffers precharge the bit lines BLs or latch data corresponding to threshold voltage level of the memory cells detected in accordance with voltage change of the bit lines BLs, when the program operation, the erase operation, or the read operation for the memory cells is performed.

The Y decoder 103 selects the page buffers included in the page buffer group 102 in response to the address signal CADD transmitted from the combination sensing section 108. The random data RAD is delivered to the page buffer selected by the Y decoder 103, or data stored in the selected page buffer is outputted to the randomizing section 109.

As described above, the data DA inputted through the I/O buffer 111 is converted into the random data RAD by the randomizing section 109. Then, the random data RAD is stored in the page buffer group 102 through the Y decoder 103. The random data RAD stored in the page buffer group 102 is programmed to the memory cell.

Data, i.e., random data RAD stored in the memory cell, is stored in the page buffer group 102 through the read operation. The random data RAD in accordance with the read operation outputted to the Y decoder 103 is changed back into original data to be programmed by the randomizing section 109. The changed data is outputted through the I/O buffer 111.

The randomizing section 109 should have information concerning the random seed generated according to the column address RADD for the purpose of the randomizing process and the non-randomizing process.

In case that the data is randomized through above process, threshold voltage distribution is as follows.

Figure 2A:
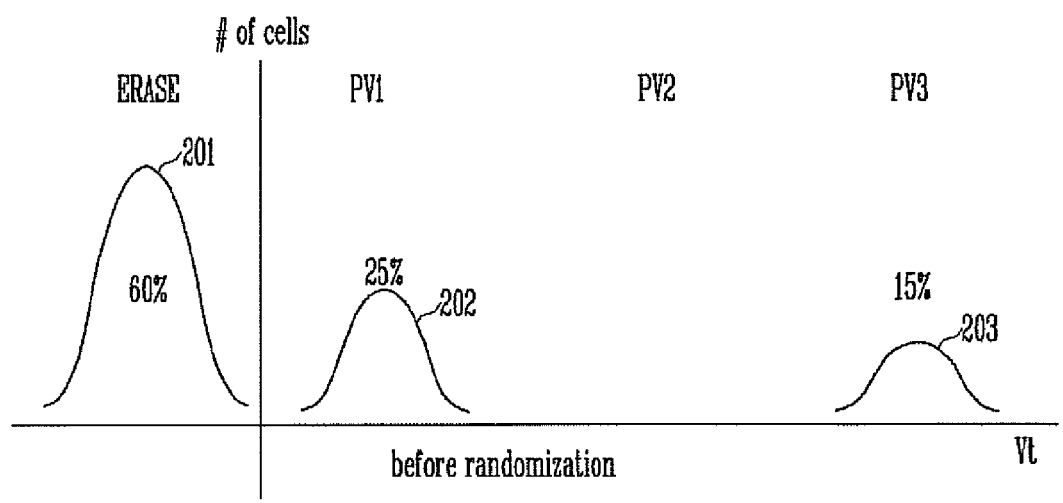
FIG. 2a and FIG. 2b are views illustrating threshold voltage distribution according to the randomizing of the data.
Figure 2B:
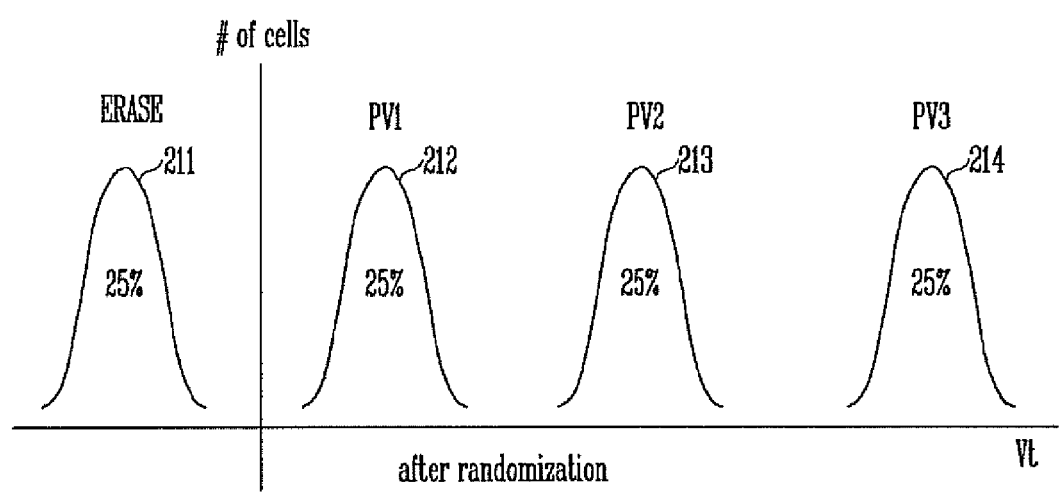

FIG. 2a and FIG. 2b are views illustrating threshold voltage distribution according to the randomizing of the data.

FIG. 2a shows threshold voltage distribution when program operation is performed without randomizing data. FIG. 2b illustrates threshold voltage distribution when program operation is performed after data is randomized.

Referring to FIG. 2a, the threshold voltage distribution of the memory cell before the data is randomized has first to third threshold voltage distributions 201, 202 and 203. Threshold voltages of the memory cells are concentrated on the first threshold voltage distribution 201.

However, it is verified through FIG. 2b that threshold voltages of the memory cells are distributed uniformly on first to fourth threshold voltage distributions 211 to 214. That is, the threshold voltages are distributed on each of the first to the fourth threshold voltage distributions 211 to 214 by approximately 25% as shown in FIG. 2b when the data is randomized.

In a case when the threshold voltages are distributed uniformly on the threshold voltage distributions as shown in FIG. 2b, interference phenomenon may reduce when data is programmed or read. Reliability of the data may be enhanced.

However, in a case when the randomizing section 109 is included in the semiconductor memory device 100 as shown in FIG. 1, circuitry area of the semiconductor memory device 100 increases. Furthermore, random value is generated differently depending on address of each of the pages. It is inconvenient that data should be outputted to outside and be inputted again when the data stored in a page of a memory block shifts to a page of another memory block in copyback operation because scramble operation and descramble operation for the random data is performed by extra circuit for performing XOR operation.

That is, if the semiconductor memory device 100 including the randomizing section 109 means to perform the copyback operation, read data is descrambled by the randomizing section 109 and is outputted to outside. Then the outputted data is inputted again to the randomizing section 109. The inputted data is scrambled and programmed. Since period of time for outputting the data in the semiconductor memory device 100 to outside or period of time where the data is inputted again is long, total time of the copyback operation becomes long considerably.

Accordingly, the present invention provides a semiconductor memory device for randomizing data without including a circuit for randomizing data.

Figure 3:
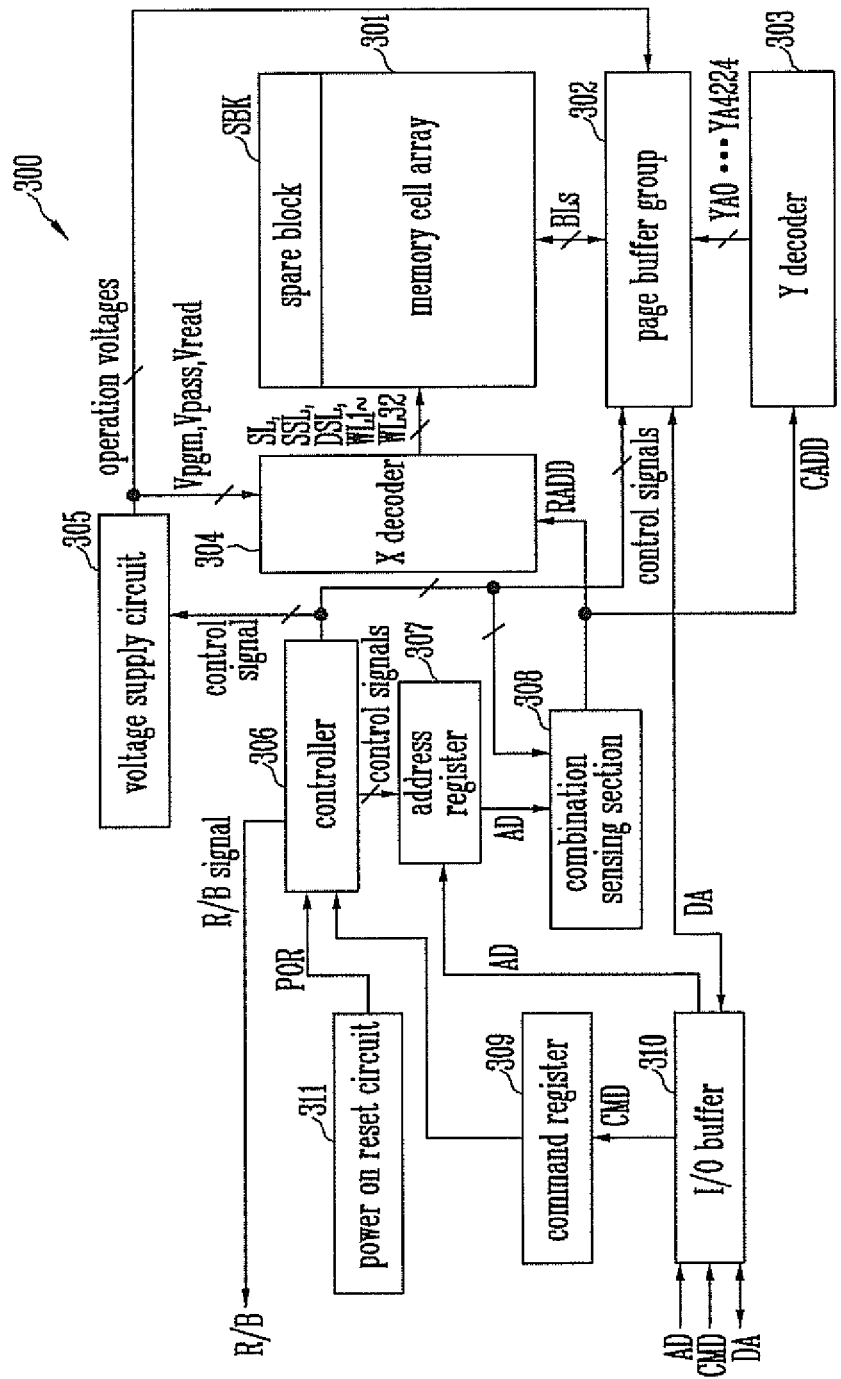
FIG. 3 is a block diagram illustrating a semiconductor memory device according to a first exemplary embodiment of the present invention.

FIG. 3 is a block diagram illustrating a semiconductor memory device according to a first exemplary embodiment of the present invention.

In FIG. 3, a semiconductor memory device 300 of the present embodiment includes a memory cell array 301 having a spare block SBK.

The memory cell array 301 includes memory blocks having the same circuit constitution as the spare block SBK. Description concerning each of the memory blocks will be described again in detailed description of the spare block SBK.

Random data for randomization of data is stored in the spare block SBK. The random data stored in the spare block SBK will be described below.

The semiconductor memory device 300 includes an operation circuit group 302 to 305 and 307 to 311 for performing program operation or read operation of memory cells in the memory cell array 301 and a controller 306 for controlling the operation circuit group 302 to 305 and 307 to 311.

The operation circuit group includes a page buffer group 302, a Y decoder 303, an X decoder 304, a voltage supply circuit 305, an address register 307, a combination sensing section 308, a command register 309, an I/O buffer 310, and a power on reset circuit 311.

In a case when a supply voltage starts to be applied to the semiconductor memory device 300, the power on reset circuit 311 outputs a power on reset signal POR when the applied supply voltage increases up to the constant voltage level. As a result, the controller 306 performs an initialization operation.

The controller 306 outputs a read/busy signal R/B, while the program operation, the read operation, an erase operation, or the like is internally performed.

An address AD, a command signal CMD, and a data DA are inputted to the I/O buffer 310 from outside.

The I/O buffer 310 delivers the inputted command signal CMD to a command register 309. The I/O buffer 310 transmits the inputted address AD to an address register 307.

The command register 309 stores temporarily the command signal CMD. The address register 307 stores temporarily the address AD.

The data DA is delivered to the page buffer group 302 through the Y decoder 303.

The controller 306 outputs internally control signals in response to the command signal CMD stored temporarily in the command register 309.

The control signals outputted from the controller 306 includes voltage control signals for controlling operation of a high voltage generator 305, page buffer control signals for controlling operation of the page buffer group 302, and control signals for controlling operation of a combination sensing section 308.

The address AD stored in the address register 307 is delivered to the combination sensing section 308. The combination sensing section 308 outputs a row address RADD and a column address CADD using the address AD stored in the address register 307.

The row address RADD is transmitted to an X decoder 304. The column address CADD is provided to the Y decoder 303.

The Y decoder 303 delivers the data DA to the page buffer group 302 according to the column address CADD.

The voltage supply circuit 305 provides operation voltages, e.g., Vpgm, Vpass, Vread, and etc., for programming, reading, or erasing memory cells to the X decoder 304 through global lines in response to the control signals transmitted from the controller 306.

The X decoder 304 selects one of memory blocks in the memory cell array 301 according to the row address RADD provided from the combination sensing section 308 to connect word lines WLs of the selected memory block to the global lines.

The page buffer group 302 includes page buffers (not shown) connected to bit lines BLs, respectively. The page buffers may precharge the bit lines BLs when the program operation, the erase operation, or the read operation for the memory cells is performed. The page buffers may latch data corresponding to threshold voltage level of the memory cells according to voltage change of the bit lines BLs. The memory cell array 301 and the page buffer group 302 will be described below.

The semiconductor memory device 300 of the present embodiment randomizes data by using the random data stored in the spare block SBK. Hereinafter, the spare block SBK and the page buffer group 302 will be described in detail before the randomizing operation is described.

Figure 4:
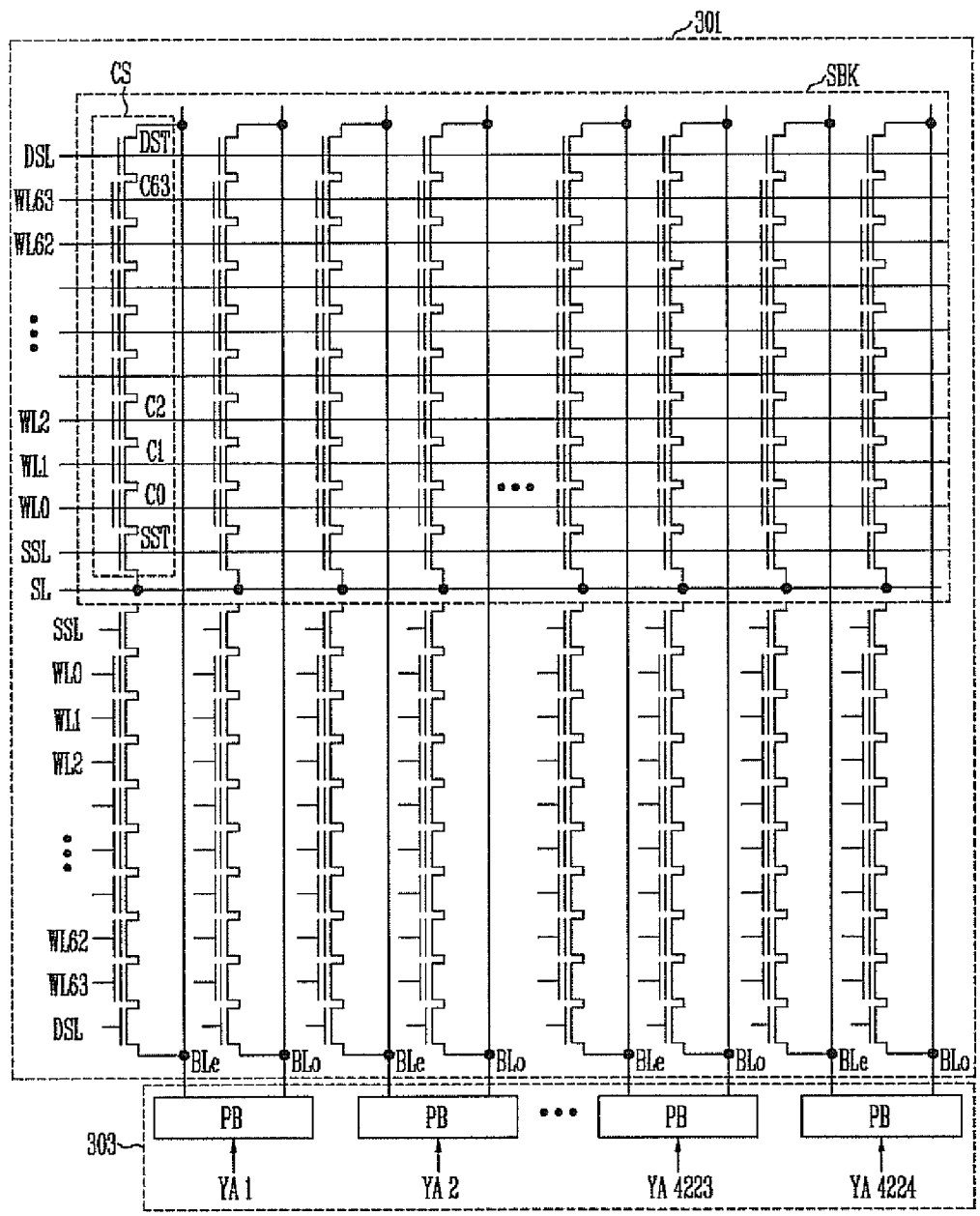
FIG. 4 is a view illustrating connection structure of the memory cell array and the page buffer group in FIG. 3.

FIG. 4 is a view illustrating connection structure of the memory cell array and the page buffer group in FIG. 3.

Referring to FIG. 4, the spare block SBK of the memory cell array 301 has the same circuit constitution as the memory blocks. The spare block SBK will be described.

The spare block SBK includes cell strings CS. The cell string CS comprises a drain select transistors DST, a source select transistor SST, and 0th to 63th memory cells C0 to C63. The 0th to 63th memory cells C0 to C63 are connected in serial between the drain select transistor DST and the source select transistor SST.

Gates of the drain select transistors DST in the cell strings are connected to a drain select line DSL. Gates of the source select transistors SST are connected to a source select line SSL.

Drain of each of the drain select transistors DST is connected to a bit line BL. Sources of the source select transistors SST are commonly connected to a source line SL.

The bit line BL is divided into an even bit line BLe and an odd bit line BLo. A pair of bit lines including the odd bit line BLe and the odd bit line BLo is connected to a page buffer PB.

The gates of the 0th to 63th memory cells C0 to C63 are connected to 0th to 63th word lines WL0 to WL63, respectively.

Constitution of this spare block SBK is identical to that of the memory block.

On the other hand, every memory cell in the spare block SBK and the memory block according to the first embodiment operates as a single level cell.

The program operation or the read operation is performed generally in a unit of page. One word line corresponds to one page in the single level cell.

On the other hand, the memory cell may operate as a multi level cell not the single level cell. In a case when the memory cell operates as the multi level cell, a plurality of logical pages is included in one word line. For example, if data stored in the memory cell operating as the multi level cell is data of 2 bits, one word line includes two logical pages. Two logical pages are divided into a least significant bit LSB page and a most significant bit page.

Every memory cell in the spare block SBK and the memory block according to the first embodiment in FIG. 3 operates as the single level cell as described above.

Accordingly, each of the word lines in the spare block SBK corresponds to each of the word lines in the memory block. For example, when the program operation is performed by selecting a first word line WL1 in the memory block, the random data is read from a first word line WL1 of the spare block SBK. Data randomized by using the read random data is programmed to the first word line WL1 of the memory block.

Random seeds for randomizing data are stored in memory cells of the spare block SBK. The random seeds perform the same function as the random seed generated by the randomizing section 109 in FIG. 1 according to the column address CADD.

Table 1 shows example of random data stored in the spare block SBK,

TABLE 1

|      | YA1 | YA2 | YA3 | ... | ... | ... | ... | YA4223 | YA4224 |
|------|-----|-----|-----|-----|-----|-----|-----|--------|--------|
| WL63 | 1   | 0   | 1   | 1   | 0   | 1   | 0   | 1      | 1      |
| WL62 | 0   | 1   | 0   | 0   | 0   | 1   | 1   | 0      | 0      |
| .    | 1   | 1   | 0   | 0   | 1   | 0   | 1   | 0      | 1      |
| .    | 0   | 0   | 1   | 1   | 0   | 1   | 0   | 1      | 0      |
| .    | 1   | 1   | 1   | 0   | 0   | 0   | 1   | 1      | 1      |
| .    | 1   | 0   | 0   | 1   | 0   | 0   | 1   | 0      | 0      |
| .    | 0   | 1   | 0   | 1   | 0   | 1   | 0   | 1      | 0      |
| .    | 1   | 1   | 0   | 0   | 1   | 0   | 1   | 0      | 1      |
| .    | 0   | 0   | 1   | 1   | 0   | 1   | 0   | 1      | 0      |
| WL2  | 1   | 1   | 1   | 0   | 0   | 0   | 1   | 1      | 1      |
| WL1  | 1   | 0   | 0   | 1   | 0   | 0   | 1   | 0      | 0      |
| WL0  | 0   | 1   | 0   | 1   | 0   | 1   | 0   | 1      | 0      |

The random seeds stored in the spare block SBK shown in Table 1 are used for randomizing the data to be stored in the memory block.

A program method in the semiconductor memory device 300 according to the first embodiment of the present invention is as follows.

The program method selects a page of the spare block SBK corresponding to the same address as a page selected for the programming.

The program method reads data of corresponding page. The program method stores random seeds read from each of the memory cells in the page buffer group 302.

The program method stores data to be programmed inputted through the I/O buffer 310 in the page buffer group 302 through the Y decoder 303. Here, page buffers PB of the page buffer group 302 should have a latch for storing the random seeds and another latch for storing the data to be programmed. The page buffers PB should also include a latch for storing a result generated by performing XOR operation about the random seed and the data to be programmed.

Finally, the result means the randomized data. The randomized data is programmed to a memory cell of a page selected for programming.

Following page buffer circuit is needed to perform the above programming.

Figure 5:
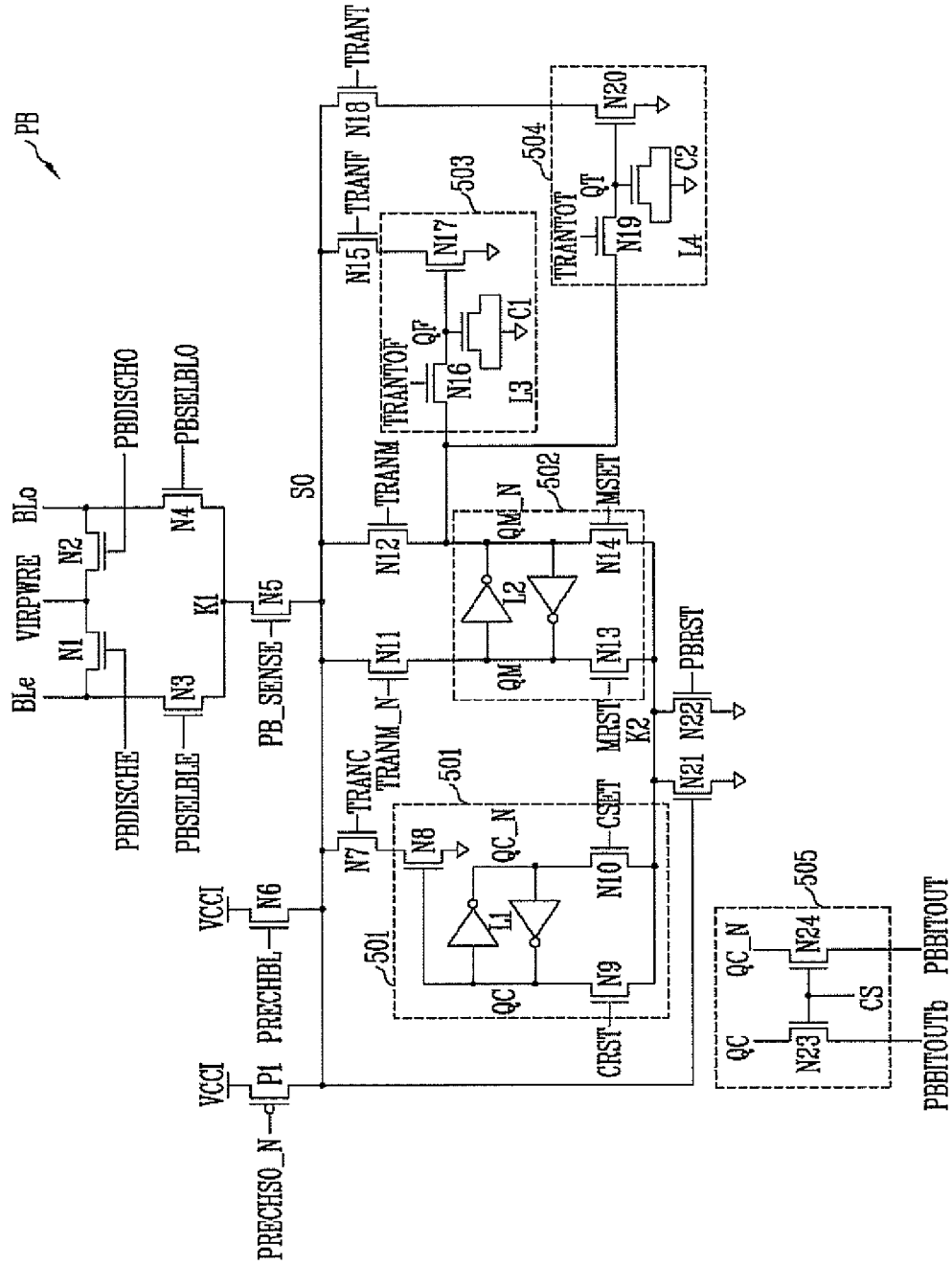
FIG. 5 is a view illustrating the page buffer shown in FIG. 4.

FIG. 5 is a view illustrating the page buffer in FIG. 4.

In FIG. 5, the page buffer PB includes first to 24th NMOS transistors N1 to N24, a first PMOS transistor P1, first and second capacitors C1 and C2, and first and second latches L1 and L2.

The first to fourth NMOS transistors N1 to N4 indicate a bit line select circuit for selecting one of the even bit line BLe and the odd bit line BLo.

A fifth NMOS transistor N5 connects the bit line selected by the bit line select circuit to a sensing node SO in response to a sensing signal PB_SENSE.

The first PMOS transistor P1 and a sixth NMOS transistor N6 function as a precharge circuit for precharging the sensing node SO.

An eighth to tenth NMOS transistors N8 to N10 and the first latch L1 indicate a first latch section 501. The second latch L2 and thirteenth and fourteenth NMOS transistors N13 and N14 are included in a second latch section 502. The first latch L1 and the second latch L2 are a static latch including two inverters.

Sixteenth and seventeenth NMOS transistors N16 and N17 and the first capacitor C1 constitute a third latch section 503. Nineteenth and twentieth NMOS transistors N19 and N20 and the second capacitor C2 indicate a fourth latch section 504.

The first latch section 501 functions as a cache latch section for input/output of data. The second latch section 502 functions as a main latch section used for programming operation, reading operation, and etc.

The third latch section 503 functions as a flag latch section for storing flag data. The fourth latch section 504 functions as a temporary latch section for storing temporarily data.

The third latch section 503 and the fourth latch section 504 are dynamic latches.

Seventh, eleventh, twelfth, fifteenth, and eighteenth NMOS transistors N7, N11, N15, and N18 are a transmission circuit for transmitting data stored in the first to the fourth latch sections 501 to 504 to the sensing node SO.

A twenty-first NMOS transistor N21 functions as a sensing circuit turned on/off according to voltage level of the sensing node SO. A twenty-second transistor N22 is a reset circuit used for resetting data in the first to the fourth latch sections 501 to 504.

Twenty-third and twenty-fourth NMOS transistors N23 and N24 are a data input circuit 505 for providing data inputted for the Y decoder 303 to the first latch section 501.

Detailed connection relation of elements in the page buffer PB is as follows.

The first and the second NMOS transistors N1 and N2 are connected in serial between the even bit line BLe and the odd bit line BLo. A variable voltage VIRPWR is applied to a node between the first and the second transistors N1 and N2. The variable voltage VIRPWR means a voltage variable from a ground voltage to level of a supply voltage.

An even discharge signal PBDISCHE is inputted to a gate of the first NMOS transistor N1. An odd discharge signal PBDISCHO is inputted to a gate of the second NMOS transistor N2.

The third NMOS transistor N3 is connected between the even bit line BLe and a node K1. The fourth NMOD transistor N4 is connected between the odd bit line BLo and the node K1.

An even select signal PBSELBLE is inputted to a gate of the third NMOS transistor N3. An odd select signal PBSELBLO is inputted to a gate of the fourth NMOS transistor N4.

The fifth NMOS transistor N5 is connected between the node K1 and the sensing node SO. A sensing signal PB_SENSE is inputted to a gate of the fifth NMOS transistor N5.

The first PMOS transistor P1 is connected between a voltage input terminal VCCI and the sensing node SO. A precharge signal PRECHSO_N is inputted to a gate of the first PMOS transistor P1.

The sixth NMOS transistor N6 is connected between a voltage input terminal PB_VPRE and the sensing node SO. A bit line precharge signal PRECHBL is inputted to a gate of the sixth NMOS transistor N6.

The bit line precharge signal PRECHBL means a signal applied for precharging the bit line through the sensing node SO.

The seventh and the eighth NMOS transistors N7 and N8 are connected in serial between the sensing node SO and a ground node. A first transmission signal TRANC is inputted to a gate of the seventh NMOS transistor N7. A gate of the eight NMOS transistor N8 is connected to a node QC.

The first latch L1 is connected between the node QC and a node QC_N.

The ninth NMOS transistor N9 is connected between the node QC and a node K2. The tenth NMOS transistor N10 is connected between the node QC_N and the node K2.

A first reset signal CRST is inputted to a gate of the ninth NMOS transistor N9. A first set signal CSET is inputted to a gate of the tenth NMOS transistor N10.

The eleventh NMOS transistor N11 is connected between the sensing node SO and a node QM. The twelfth NMOS transistor N12 is connected between the sensing node SO and the node QM_N. A second transmission signal TRANM_N is inputted to a gate of the eleventh NMOS transistor N11. A third transmission signal TRANM is inputted to a gate of the twelfth NMOS transistor N12.

The second transmission signal TRANM_N and the third transmission signal TRANM have an opposite logic level against each other.

The second latch L2 is connected between the node QM and the node QM_N.

The thirteenth NMOS transistor N13 is connected between the node QM and the node K2. A second reset signal MRST is inputted to a gate of the thirteenth NMOS transistor N13.

The fourteenth NMOS transistor N14 is connected between the node QM_N and the node K2. A second set signal MSFT is inputted to a gate of the fourteenth NMOS transistor N14.

The fifteenth and the seventeenth NMOS transistors N15 and N17 are connected in serial between the sensing node SO and the ground node.

A fourth transmission signal TRANF is inputted to a gate of the fifteenth NMOS transistor N15. A gate of the seventeenth NMOS transistor N17 is connected to a node QF.

The sixteenth NMOS transistor N16 is connected between the node QM_N and the node QF. A sixth transmission signal TRANTOF is inputted to a gate of the sixteenth NMOS transistor N16.

The first capacitor C1 includes a circuit where a drain and a source of a transistor are connected. The first capacitor C1 is connected between the node QF and the ground node.

The eighteenth and the twentieth NMOS transistors N18 and N20 are connected in serial between the sensing node SO and the ground node. A fifth transmission signal TRANT is inputted to a gate of the eighteenth NMOS transistor N18. A gate of the twentieth NMOS transistor N20 is connected to a node QT.

The nineteenth NMOS transistor N19 is connected between the node QM_N and the node QT. A seventh transmission signal TRANTOT is inputted to a gate of the nineteenth NMOS transistor N19.

The second capacitor C2 includes a circuit where a drain and a source of a transistor are connected. The second capacitor C2 is connected between the node QT and the ground node.

The first capacitor C1 and the second capacitor C2 function as the third latch L3 and the fourth latch L4, respectively.

Each of the twenty-first and the twenty-second NMOS transistors is connected between the node K2 and the ground node.

A gate of the twenty-first NMOS transistor N21 is connected to the sensing node SO. A page buffer reset signal PBRST is inputted to a gate of the twenty-second NMOS transistor N22.

The twenty-third NMOS transistor N23 is connected between the node QC and a first data node PBBITOUTb. The twenty-fourth NMOS transistor N24 is connected between the node QC_N and a second data node PBBITOUT.

A select signal CS is inputted to gates of the twenty-third and the twenty-fourth NMOS transistors N23 and N24.

Operation of the above page buffer PB will be described in a following process of randomizing data.

The program operation and the read operation of the semiconductor memory device 300 including the page buffer PB according to the first embodiment in FIG. 3 is as follows.

Figure 6:
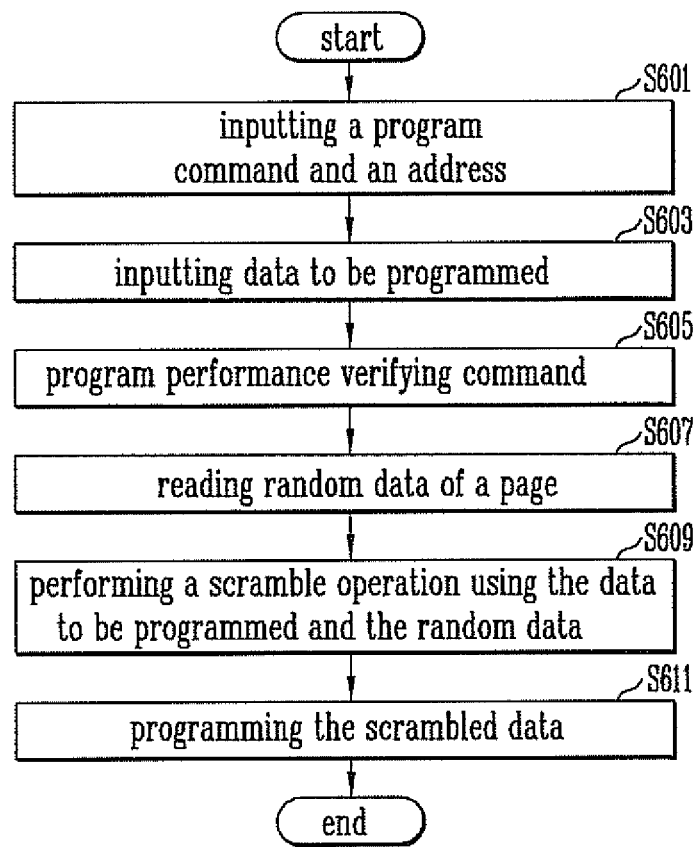
FIG. 6 is a flowchart illustrating a program method of a semiconductor memory device according to a first exemplary embodiment of the present invention.

FIG. 6 is a flowchart illustrating a program method of a semiconductor memory device according to a first exemplary embodiment of the present invention.

In FIG. 6, a program command CMD and an address CA for program operation are inputted through the I/O buffer 310 in step S601. Then, a data DA to be programmed is inputted in step S603.

The program command CMD is transmitted to the controller 306 through the command register 309. The controller 306 starts to prepare programming according to the program command CMD. The preparation of the programming includes voltage generation start for a program operation and reset operation control of the page buffer, etc.

The data DA to be programmed is inputted to each of the page buffers PB in the page buffer group 302.

In case when a program performance verifying command for performing program is inputted to the I/O buffer 310 in step S605, the controller 306 selects a page of the spare block SBK having the same address as a programmed page. The controller 306 reads random seeds stored in memory cells connected to the selected page in step S607.

For example, in a case when the address of the programmed page corresponds to a thirtieth word line WL30, the controller 306 selects the thirtieth word line WL30 of the spare block SBK. The controller 306 reads random seeds stored in memory cells connected to the thirtieth word line WL30 to store the read random seeds in the page buffer group 302.

The data DA to be programmed inputted in the step S603. The random seeds read in the step S607 are stored in different latches of the page buffer PB.

In step S609, XOR operation is performed about the data DA to be programmed and the random seeds. The data DA is scrambled to randomized data. The XOR operation may be performed through data shift between the latches of the page buffer PB. In other words, the page buffer PB randomizes the data. The scrambled randomized data is stored in another latch of the page buffer PB.

Randomization of the data using the page buffer PB will be described in detail below.

The controller 306 controls the operation circuit group to program the scrambled randomized data in the step S609 to the memory cells of the page selected according to the address.

On the other hand, a method of reading data from the programmed memory cell based on the randomized data to output the read data is described as follows.

Figure 7:
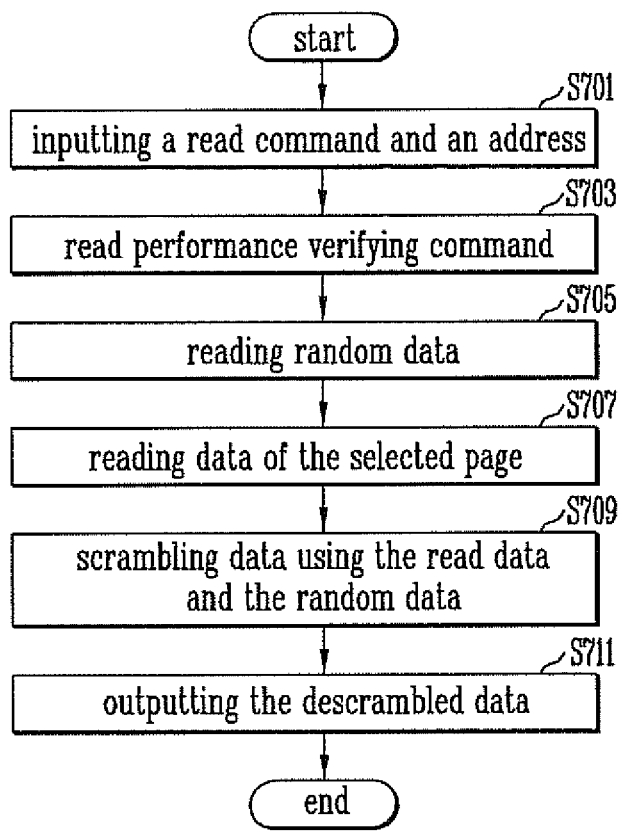
FIG. 7 is a flowchart illustrating a read operation of the semiconductor memory device according to a first exemplary embodiment of the present invention.

FIG. 7 is a flowchart illustrating a read operation of the semiconductor memory device according to a first exemplary embodiment of the present invention.

In FIG. 7, a read command CMD and an address AD for the read operation are inputted through the I/O buffer 310 in step S701. A read verification command is inputted in step S703.

In step S705, the controller 306 detects an address of a page for the reading according to the inputted address AD, selects a page having the same address as the page in the spare block SBK, and reads random data.

For example, in a case when a read command about a thirtieth word line WL30 of specific block in the memory cell array 310 is inputted, the controller 306 reads firstly random seeds stored in memory cells connected to a thirtieth word line WL30 of the spare block SBK.

The read data is stored in the page buffer group 302.

In step S707, data is read from the page selected according to the inputted address AD, e.g., from the memory cells connected to the thirtieth word line WL30 of the specific block.

The step of reading the random seeds and the step of reading the data from the selected page may be changed in order.

Descramble operation is performed by using the random seeds read in the step S705 and the data read in the step S707 in step S709. Descrambled data is outputted finally in step S711.

The scramble operation using the random data in FIG. 6 and the descramble operation using the random data in FIG. 7 are performed in the page puffer PB in FIG. 5. Hereinafter, this operation will be described in detail.

The data to be programmed in the step S603 in FIG. 6 is transmitted to the page buffer group 302 through the Y decoder 303. Reset operation of the page buffer group 302 is completed before the data is inputted. Data stored in each of nodes in the page buffer PB will be assumed as '1' when voltage of each of the nodes is high level and will be assumed as '0' when the voltage is low level for convenience of description.

The node QC_N and the node QM_N of the first and the second latches L1 and L2 have '1' state according to the reset operation. As a result, the nodes QC and QM have '0' state.

The data to be programmed inputted through the Y decoder 303 is inputted to the node QC_N of the first latch L1.

The random seed is read according to the step S607. The read random seed is stored in the node QM_N of the second latch L2. The page address of the page where the random seed is read is identical to that of the page where the program operation is performed. However, block addresses corresponding to the pages are different.

Following Table 2 shows state of each of the nodes in the latch of the page buffer PB according to input of the data and read of the random seed.

TABLE 2

|   | QC_N | QM_N | QT |
|---|------|------|-----|
| A | 1 | 1 | — |
| B | 1 | 0 | — |
| C | 0 | 1 | — |
| D | 0 | 0 | — |

The reason that four kinds of A, B, C, and D is shown in Table 2 is as follows.

The data to be programmed inputted to the node QC_N is '1' or '0'. The random seed for randomizing is '1' or '0'.

That is, A and B mean states of the node corresponding to the random seed of '1' or '0' when data '1' is inputted. C and D indicate states of the node corresponding to the random seed of '1' or '0' when data '0' is inputted.

The random seed read in the step S607 is stored in the node QM_N of the second latch L2. The address of the page from which the random seed is read is identical to that of the page about which the program operation is performed. However, addresses of blocks corresponding to the pages are different.

The scramble process of performing XOR operation about the read random seed and the data to be programmed according to the step S609 is needed.

To perform the scramble process, the random seed stored in the second latch L2 shifts to the fourth latch L4. In other words, the data stored in the node QC_N shifts to the node QT.

No electric charges are charged in the first capacitor C1 and the second capacitor C2 by initializing the page buffer PB. Accordingly, electric charges may be charged in the second capacitor C2 connected to the node QT in accordance with the data stored in the node QM_N.

That is, in a case when the seventh transmission signal TRANTOT having high level is inputted under the condition that the node QM_N is '1' state, the node QM_N is connected to the node QT. '1' state of the node QM_N means that voltage of the node QM_N is high level as mentioned above. Accordingly, electric charges are charged in the second capacitor C2 depending on the voltage of the node QM_N. As a result, the node QT becomes '1' state.

In a case when the node QM_N is '0' state, no electric charges are charged in the second capacitor C2 because the voltage of the node QM_N is low level state. Accordingly, the node QT is '0' state.

The nodes QM_N and QT have the same state according to the above process.

Subsequently, state of the node QM_N of the second latch L2 is changed according to state of the node QC_N of the first latch L1.

Particularly, the sensing node SO is precharged to high level by inputting the precharge control signal PRECHSO_N having low level.

The seventh NMOS transistor N7 is turned on by inputting the First transmission signal TRANC having high level thereto.

The eighth NMOS transistor N8 is turned on or turned off depending on state of the node QC.

According to Table 2, the node QC has '0011' state in an order of A, B, C, and D.

That is, the eighth NMOS transistor N8 is turned off in case of A and B. But, the eighth NMOS transistor N8 is turned on in case of C and D.

Since the eighth NMOS transistor N8 is turned off in case of A and B, the voltage precharged to the sensing node SO is maintained.

The twenty-first NMOS transistor N21 is turned on by the voltage precharged to the sensing node SO. Accordingly, the node K2 is connected to the ground node.

Here, in a case when the second reset signal MRST is inputted with high level, the node QM is connected to the ground node via the node K2.

Since the node QM_N is '10' state in case of A and B in Table 2, the node QM is '01' state. In a case when the QM is connected to the ground node, the state of the node QM is changed from '01' to '00'. In other words, the node QM_N is changed to '11'.

State of the node in each of the page buffers PB changed according to the above operation is shown in Table 3.

TABLE 3

|   | QC_N | QM_N | QT |
|---|------|------|-----|
| A | 1 | 1 | 1 |
| B | 1 | ① | 0 |
| C | 0 | 1 | 1 |
| D | 0 | 0 | 0 |

The changed data is marked as 'O' in Table 3.

Data of the first latch L1 is changed by using data stored in the fourth latch L4 after data of the second latch L2 is changed by using the data of the first latch L1.

To change the data as mentioned above, the sensing node SO is precharged.

The fifth transmission signal TRANT is inputted with high level. Accordingly, the eighteenth NMOS transistor N18 is turned on.

The twentieth NMOS transistor N20 is turned on or turned off according to the node QT. State of the node QT is shown in Table 2. That is, the node QT is '1010' in order of A, B, C, and D. As a result, the twentieth NMOS transistor N20 is turned on in cases of A and C, but it is turned off in case of B and D.

The sensing node SO maintains precharging state when the twentieth NMOS transistor N20 is turned off. In other words, the sensing node SO keeps the precharging state in cases of B and D.

In case when the sensing node SO maintains precharging state, the twenty-first NMOS transistor N21 is turned on and the node K2 is connected to the ground node.

Here, in case when the first set signal CSET is inputted with high level, the node QC_N is connected to the ground node through the node K2.

That is, in cases of B and D, the state of the node QC_N is changed from '10' to '00'. The state of the node QC_N is shown in Table 4.

TABLE 4

|   | QC_N | QM_N | QT |
|---|------|------|-----|
| A | 1 | 1 | 1 |
| B | ⓪ | 1 | 0 |
| C | 0 | 1 | 1 |
| D | 0 | 0 | 0 |

The node QC_N is changed only in the case of B as shown in Table 4.

Finally, the XOR operation is completed by changing the state of the node QM_N using the data of the node QC_N.

A method of changing the state of the node QM_N using the data of the node QC_N is the same as in the above mentioned method. The data of the node QM_N is changed only when the node QC has '1' state.

In Table 4, the node QC_N has '1000' in order of A, B, C, and D. Accordingly, the node QC has '0111'. As a result, the data of the node QM_N may be changed in case of A.

In the case of A, the sensing node SO maintains precharging state and the node QM is connected to the ground node when the second reset signal MRST is inputted with high level.

Accordingly, the state of the node QM_N is changed as shown in Table 5.

TABLE 5

|   | QC_N | QM_N | QT |
|---|---|---|---|
| A | 1 | ⓪ | 1 |
| B | 0 | 1 | 0 |
| C | 0 | 1 | 1 |
| D | 0 | 0 | 0 |

The state of the node QM_N shown in Table 5 indicates the scramble data which is data when XOR operation is completed.

In a case when the XOR operation is performed, the result of the XOR operation is '0' when two input values are the same. But, the result is '1' when two input values are different.

The result of XOR operation about the node QC_N and the node QM_N shown in Table 2 is identical to the state of the node QM_N in Table 5.

The program operation is performed according to the data of the node QM_N. Since the program operation is well known, any further description concerning the program operation will be omitted.

In a case when the scramble data is programmed, it should be descrambled to original data when the data is read.

Hereinafter, a descramble operation of the read data will be described in detail.

The descramble operation will be described with reference to drawings FIG. 5 and FIG. 7.

The page of the spare block SBK is selected by performing the step S705 according to the address inputted in the step S701 in FIG. 7. The random seeds are read. The read random seed is stored in the node QM_N of the second latch L2. Data of a page corresponding to the inputted address should be read, and thus the random seed stored in the node QM_N is shifted to the node QC_N of the first latch L1.

The data of the selected page is read after the second latch L2 is reset. The read data is transmitted to the fourth latch L4.

Table 6 shows state of each of the node in the page buffer PB according to the above process.

TABLE 6

|   | QC_N | QM_N | QT |
|---|---|---|---|
| E | 1 | 1 | 1 |
| F | 1 | 0 | 0 |
| G | 0 | 1 | 1 |
| H | 0 | 0 | 0 |

E, F, G, and H in Table 6 indicate state of data determined according to the read data and the random seed like the program operation.

Subsequently, the descramble operation of the random seed and the read data corresponding to the step S709 in FIG. 7 is performed.

State of the node QM_N of the second latch L2 is changed by using the state of the node QC_N of the first latch L1. To change the state, the first transmission signal TRANC is inputted with high level after the sensing node SO is precharged.

As a result, the seventh NMOS transistor N7 is turned on. The eighth NMOS transistor N8 is turned on or turned off according to the node QC. Since the node QC_N is '1100' in order of E, F, G, and H, the node QC is '0011'.

Accordingly, the eighth NMOS transistor N8 is turned on in the cases of G and H. In a case when the eighth NMOS transistor N8 is turned on, a voltage precharged to the sensing node SO is discharged to the ground node. In the cases of E and F, the sensing node SO maintains the precharge voltage. Here, in case that the second reset signal MRST is inputted with high level, the node QM is connected to the ground node.

Accordingly, data is changed as shown in following Table 7.

TABLE 7

|   | QC_N | QM_N | QT |
|---|---|---|---|
| E | 1 | 1 | 1 |
| F | 1 | ① | 0 |
| G | 0 | 1 | 1 |
| H | 0 | 0 | 0 |

Referring to Table 7, the node QM_N is changed from '0' to '1' in case of F.

The state of the node QC_N of the first latch L1 is changed according to the node QT of the fourth latch L4. The sensing node SO is precharged. The fifth transmission signal TRANT is inputted with high level.

Since the node QT is '1010' in order of E, F, G, and H, the twentieth NMOS transistor N20 is turned on only in the cases of E and G. The twentieth NMOS transistor N20 is turned off in the cases of F and H. Accordingly, the sensing node SO maintains the precharge voltage.

In case that the first set signal CSET is inputted with high level, the node QC_N is connected to the ground node. Accordingly, the data has state shown in Table 8.

TABLE 8

|   | QC_N | QM_N | QT |
|---|---|---|---|
| E | 1 | 1 | 1 |
| F | ⓪ | 1 | 0 |
| G | 0 | 1 | 1 |
| H | 0 | 0 | 0 |

Referring to Table 8, the node QC_N is changed from '1' to '0' in case of F.

Finally, the descramble operation is completed in case that the state of the node QM_N is changed according to the state of the node QC_N. In this case, the sensing node SO is precharged, and the first transmission signal TRANC is inputted with high level. The sensing node SO maintains the precharge voltage only when the node QC_N is '1', i.e., the node QC is '0' as described above.

Accordingly, in case of E, in a case when the second reset signal MRST is inputted with high level, the node QM is connected to the ground node and the node QM_N is '0'.

As a result, the node QM_N is changed from '1' to '0' in the case of E. Table 9 shows state of the node when the descramble operation is completed.

TABLE 9

|   | QC_N | QM_N | QT |
|---|------|------|-----|
| E | 1    | 0    | 1   |
| F | 0    | 1    | 0   |
| G | 0    | 1    | 1   |
| H | 0    | 0    | 0   |

The state of the node QM_N in Table 9 is data to be outputted finally.

Data of the node QM_N is delivered to the node QC_N after the node QC_N is reset. Then the delivered data is outputted.

The scramble operation and the descramble operation shown in Table 2 to Table 9 are as follows.

A in the program operation corresponds to G in the read operation. B in the program operation corresponds to E in the read operation. Additionally, C in the program operation corresponds to G in the read operation. D in the program operation corresponds to H in the read operation.

For example, in the case of A in the program operation, the data to be programmed is '1' and the random data is '1'. In the case of G in the read operation, the random data is '1' and the outputted data is '1'.

This will be described with reference to data bit stream for apparent description.

If four bit data '1100' is inputted as data to be programmed and the random seed for each of data bit is '1010', data to be programmed to the memory cell is really '0101'

The data '0101' programmed to the memory cell is read, and '1100' is outputted by descrambling the read data using the random seed '1010'.

Though the semiconductor memory device does not include a logic or circuit for extra XOR operation, the page buffer PB performs the scramble operation of randomization and the descramble operation through XOR operation according to the above process.

The random seeds stored in the spare block SBK are applied to every memory block. For example, in a case when data is programmed by selecting the twelfth word line WL12 of two memory blocks, random seed applied to data programmed to the twelfth word line WL12 of two memory blocks is data read from a memory cell connected to a twelfth word line WL12 of the spare block SBK.

Since the scramble and the descramble operations are performed in the page buffer PB when the copyback is performed, data error is prevented by the random seed. For example, if the data stored in a memory cell connected to the twelfth word line WL12 of a first memory block shifts to a memory cell connected to a fourteenth word line WL14 of a second memory block, following copyback operation is performed.

The data stored in the memory cell connected to the twelfth word line WL12 of the first memory block is read. The random seeds connected to the twelfth word line WL12 of the spare block SBK are read. Then, the descramble operation is performed by using the read data and the read random seed. The data to be outputted finally is shifted to the first latch L1.

Random seeds connected to the fourteenth word line WL14 of the spare block SBK are read. The scramble operation is performed by using the read random seed and the data stored in the first latch L1. Data generated when the scramble operation is performed is programmed to memory cells connected to the fourteenth word line WL14 of the second memory block.

The scramble operation and the descramble operation of the data are performed through the above process. However, data may not be changed. Error of data may not occur though the copyback is performed.

On the other hand, random seeds should be differently applied to each of logical pages in a word line when the memory cells operate as multi level cell to randomize effectively data.

Accordingly, the spare block SBK and the memory blocks may have constitution in following second embodiment.

Figure 8:
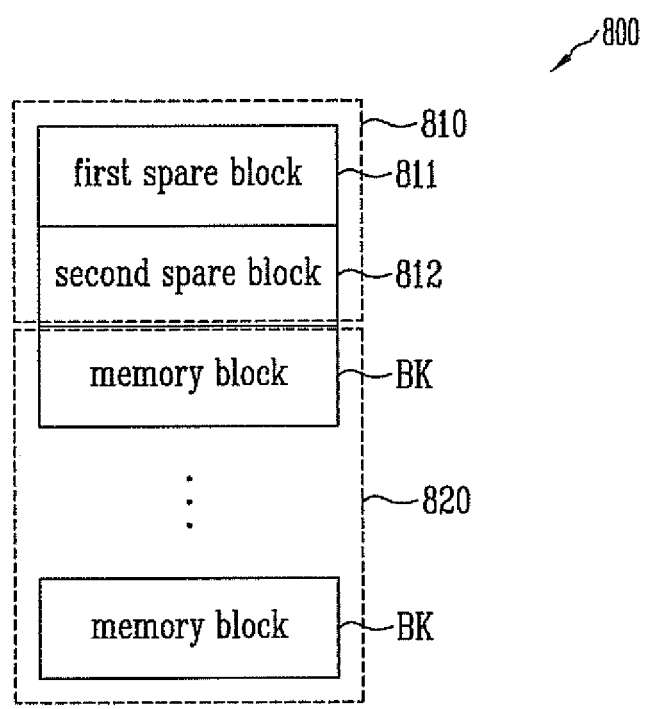
FIG. 8 is a block diagram illustrating a spare block and a memory block according to a second exemplary embodiment of the present invention.

FIG. 8 is a block diagram illustrating a spare block and a memory block according to a second exemplary embodiment of the present invention.

In FIG. 8, a spare block 810 of the present embodiment includes a first spare block 811 and a second spare block 812. A memory cell array 820 has memory blocks BK.

Each circuit of the first and the second spare blocks 811 and 812 and the memory blocks BK is the same as in FIG. 4.

The first and the second spare blocks 811 and 812 operate as single level cell. The memory blocks BK operate as multi level cell storable data of 2 bits.

The first spare block 811 stores random seed for programming of LSB page. The second spare block 812 stores random seed for programming of MSB page.

Only the spare block 810 of elements in the second embodiment is different in FIG. 3. Thus FIG. 8 shows only the memory cell array 820 and the spare block 810. Since the other peripheral circuits are the same as in FIG. 3, they will be omitted.

The second embodiment verifies whether a page selected for performing program operation or read operation is the LSB page or the MSB page. The second embodiment reads the random data from the first spare block 811 or the second spare block 812 corresponding to the pages.

For example, in a case when the page selected for the program operation is an LSB page of a first word line WL1, random seed stored in the first word line WL1 of the first spare block 811 is read. Scramble operation for randomization of data is performed by using the read random seed.

Read operation is likely to the program operation. In a case when a page selected for the read operation is an MSB page of a first word line WL1, random seed stored in the first word line WL1 of the second spare block 812 is read. The random seed is changed back into original data by performing descramble operation using the data read from the selected page and the read random seed.

The scramble operation and the descramble operation of the second embodiment are performed in the page buffer PB like FIG. 5. Since the scramble operation and the descramble operation will be described in FIG. 5, any further description concerning the operations will be omitted.

If data stored in the memory cell operating as multi level cell is data of 3 bits, the semiconductor memory device should include three spare blocks for each of logical pages.

In a case when memory cells in one spare block are operated as multi level cell, plural spare blocks does not be required. However, it is desirable that the memory cells of the spare block operate as single level cell to enhance reliability of random data.

On the other hand, a semiconductor memory device according to a third embodiment may have following constitution by using the above operation of the page buffer PB.

Figure 9:
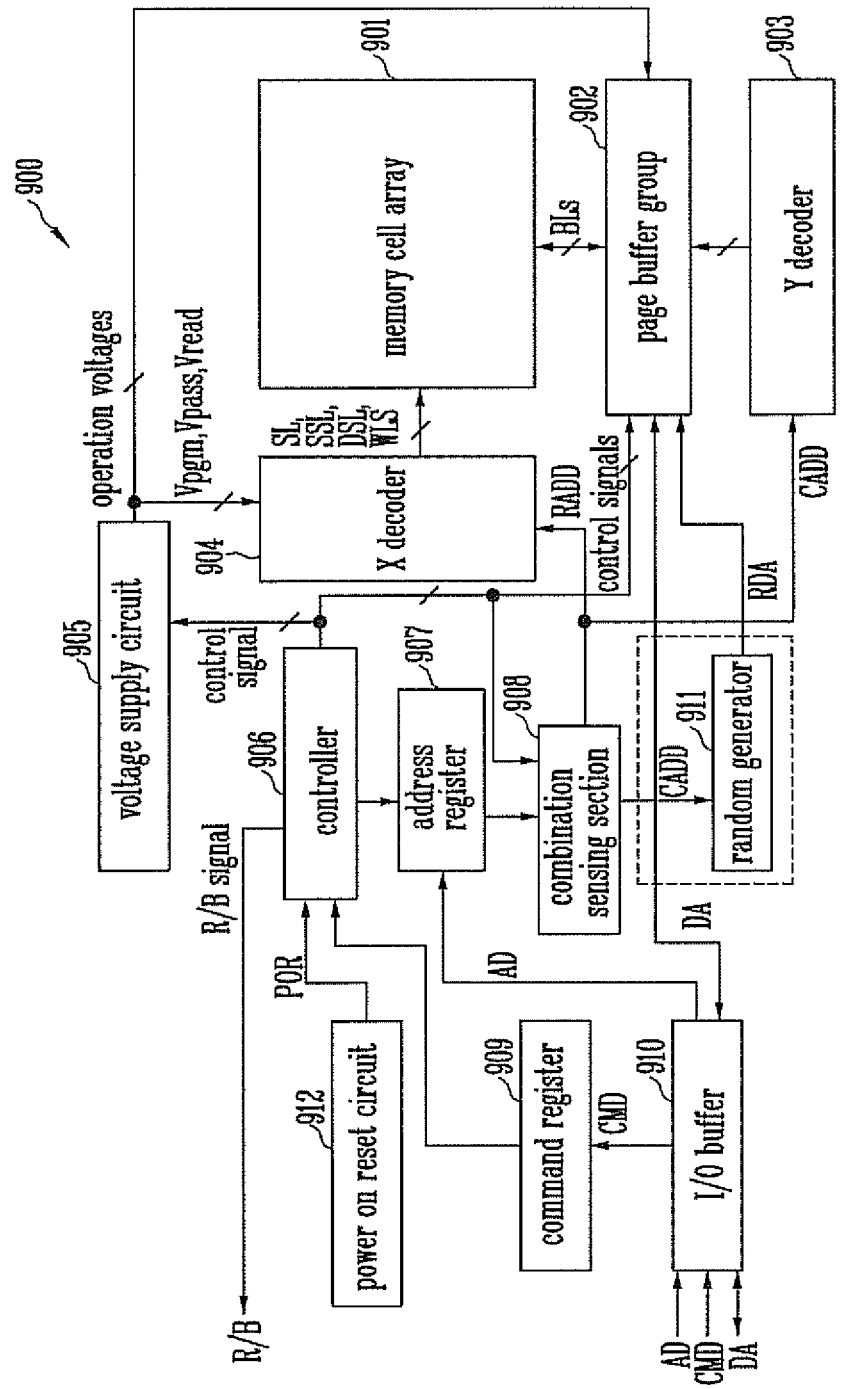
FIG. 9 is a block diagram illustrating a semiconductor memory device according to a third exemplary embodiment of the present invention.

FIG. 9 is a block diagram illustrating a semiconductor memory device according to a third exemplary embodiment of the present invention.

In FIG. 9, a semiconductor memory device of the present embodiment includes a memory cell array 901, operation circuit groups 902 to 905 and 907 to 911 for performing a program operation or a read operation of memory cells in the memory cell array 901, and a controller 906 for controlling the operation circuit groups 902 to 905 and 907 to 912.

The memory cell array 901, the operation circuit groups 902 to 905 and 907 to 912, and the controller 906 have the same constitution and function as in the first embodiment in FIG. 3.

The memory cell array 901 of the semiconductor memory device 900 according to the third embodiment does not include a spare block SBK for storing random seed. A random generator 911 generates random seed according to a column address CADD and a row address RADD. The random generator 911 provides the generated random seed to the page buffer group 902.

Accordingly, instead of the processes of reading the random seed stored in the spare block SBK in the scramble operation and the descramble operation described in FIG. 6, FIG. 7, and Table 2 to Table 9, the random seed generated from the random generator 911 is stored in a page buffer PB. Since the scramble operation and the descramble operation using the random seed is performed in the page buffer PB, extra circuit for XOR operation is not required. Furthermore, data change does not occur though copyback operation is performed because the scramble operation and the descramble operation are performed in the page buffer PB.

Although embodiments have been described with reference to a number of illustrative embodiments thereof, it should be understood that numerous other modifications and embodiments can be devised by those skilled in the art that will fall within the spirit and scope of the principles of this disclosure.

What is claimed is:

1. A semiconductor memory device, comprising:
   memory blocks including pages connected to plural main cells;
   a spare block, including pages connected to spare cells, configured to store a random seed for randomization to the spare cells connected to each page;
   page buffers, each connected to each of bit lines connected to the spare cell and the main cells, configured to scramble data inputted for program operation by using random seed read from a page of the spare block selected by a control signal to transmit the scrambled data to the bit line, and configured to descramble data read from a main cell selected for read operation and output the descrambled data; and
   a controller configured to output the control signal to select a page of the spare block corresponding to an address of a page of the memory block selected for the programming or reading, and configured to control a scramble operation and a descramble operation of the page buffers,
   wherein each of the pages includes:
   a first latch storing the first data;
   a second latch storing the random seed; and
   a third latch copying and storing the random seed stored in the second latch,
   wherein data stored in the second latch is changed using the first data stored in the first latch, data in the first latch is changed using data stored in the third latch, and the data in the second latch is changed using the data stored in the first latch during the scramble operation.

2. The semiconductor memory device of claim 1, wherein each of the pages includes:
   a first transistor and a second transistor connected in series between a sensing node connected to the bit line and a ground node, a first transmission signal being inputted to a gate of the first transistor and a gate of the second transistor being connected to a first node of the first latch;
   the first latch connected between the first node and a second node, and connected to data line for input/output of data;
   the second latch connected between a third node and a fourth node, and configured to transmit data stored in a program operation to the sensing node, or configured to store data according to voltage level of the sensing node in a read operation;
   a third transistor connected between the sensing node and the fourth node, a second transmission signal being inputted to a gate of the third transistor;
   the third latch connected between a fifth node and the ground node, and connected to a capacitor for storing temporarily the data stored in the first latch and the second latch in the program operation or the read operation; and
   a fourth transistor and a fifth transistor connected in series between the sensing node and the ground node, a third transmission signal being inputted to a gate of the fourth transistor and a gate of the fifth transistor being connected to the fifth node.

3. A semiconductor memory device, comprising:
   a memory block where memory cells connected to word lines are divided into physical pages, and each of the physical pages are divided into a first logical page and a second logical page;
   a first spare block configured to have physical pages connected to first spare cells, each of the physical pages storing a random seed for randomization of data corresponding to each of the first logical pages of the memory block;
   a second spare block configured to have physical pages connected to second spare cells, each of the physical pages storing a random seed for randomization of data corresponding to each of the second logical pages of the memory block;
   page buffers connected to the first and the second spare cells and each of bit lines connected to main cell, configured to scramble data inputted for program operation by using the random seed read from the physical page of the first spare block and the second spare block and program the scrambled data to the main cell, and configured to descramble data read from the main cell by using the random seed and output the descrambled data for read operation; and
   a controller configured to control the control signal for selecting the physical page of the first or the second spare block corresponding to an address of a page selected for one of the program operation and the read operation, and control the scramble operation and the descramble operation of the page buffers,
   wherein each of the pages includes:
   a first latch storing the random seed;
   a second latch storing data read from the main cell; and
   a third latch copying and storing the data stored in the second latch, wherein the data in the second latch is changed using data stored in the first latch, the data stored in the first latch is changed using the data stored in the third latch, and the data in the second latch is changed using the data stored in the first latch during the descramble operation.

4. The semiconductor memory device of claim 3, wherein each of the pages includes:
 a first transistor and a second transistor connected in series between a sensing node connected to the bit line and a ground node, a first transmission signal being inputted to a gate of the first transistor and a gate of the second transistor being connected to a first node of the first latch;
 the first latch connected between the first node and a second node, and connected to data line for input/output of data;
 the second latch connected between a third node and a fourth node, and configured to transmit data stored in a program operation to the sensing node, or configured to store data according to voltage level of the sensing node in a read operation;
 a third transistor connected between the sensing node and the fourth node, a second transmission signal being inputted to a gate of the third transistor;
 the third latch connected between a fifth node and the ground node, and connected to a capacitor for storing temporarily the data stored in the first latch and the second latch in the program operation or the read operation; and
 a fourth transistor and a fifth transistor connected in series between the sensing node and the ground node, a third transmission signal being inputted to a gate of the fourth transistor and a gate of the fifth transistor being connected to the fifth node.

5. A semiconductor memory device, comprising:
 memory blocks including pages connected to plural main cells;
 a random number generator configured to output a random seed according to an address for data scramble for program operation and data descramble for read operation;
 page buffers connected to each of bit lines connected to the main cells, configured to scramble data inputted for the program operation by using the random seed inputted from the random generator and transmit the scrambled data to the bit line, and configured to descramble data read through the bit line by using the random seed and output the descrambled data in the read operation; and
 a controller configured to control the random generator to generate the random seed according to an address of a page selected for the program and read operations, and control the page buffer to scramble data to be programmed by using the random seed and descramble read data,
 wherein each of the pages includes:
  a first latch storing the data to be programmed;
  a second latch storing the random seed; and
  a third latch copying and storing the random seed stored in the second latch,
  wherein data stored in the second latch is changed using data stored in the first latch, the data in the first latch is changed using data stored in the third latch, and the data stored in the second latch is changed using the data stored in the first latch.

6. The semiconductor memory device of claim 5, wherein each of the pages includes:
 a first transistor and a second transistor connected in series between a sensing node connected to the bit line and a ground node, a first transmission signal being inputted to a gate of the first transistor and a gate of the second transistor being connected to a first node of the first latch;
 the first latch connected between the first node and a second node, and connected to data line for input/output of data;
 the second latch connected between a third node and a fourth node, and configured to transmit data stored in a program operation to the sensing node, or configured to store data according to voltage level of the sensing node in a read operation;
 the third transistor connected between the sensing node and the fourth node, a second transmission signal being inputted to a gate of the third transistor;
 a third latch connected between a fifth node and the ground node, and connected to a capacitor for storing temporarily the data stored in the first latch and the second latch in the program operation or the read operation; and
 a fourth transistor and a fifth transistor connected in series between the sensing node and the ground node, a third transmission signal being inputted to a gate of the fourth transistor and a gate of the fifth transistor being connected to the fifth node.

7. A method of operating a semiconductor memory device, comprising:
 storing first data inputted for programming in a first latch of a page buffer;
 storing a random seed for randomization of data in a second latch of the page buffer;
 scrambling data using the first data stored in the first latch and the random seed stored in the second latch to store the scrambled data in the second latch; and
 programming the scrambled data stored in the second latch to a memory cell connected to a page selected for the programming,
 wherein the step of scrambling the data includes:
  copying the random seed stored in the second latch to a third latch of the page buffer;
  changing data of the second latch using the first data stored in the first latch;
  changing the data of the first latch using data stored in the third latch; and
  changing the data of the second latch using the data stored in the first latch.

8. The method of claim 7, wherein the step of storing the random seed in the second latch includes reading data stored in a page of a spare block corresponding to the page selected for the programming and storing the read data in the second latch.

9. The method of claim 7, wherein the step of storing the random seed in the second latch includes storing the random seed generated according to an address in the second latch.

10. The method of claim 7, wherein an XOR operation is performed of the first data and the random seed according to a scramble operation using the first data stored in the first latch and the random seed stored in the second latch, and result of the XOR operation is stored in the second latch.

11. A method of operating a semiconductor memory device, comprising:
 storing a random seed for randomization of data in a first latch of a page buffer;
 reading data stored in a memory cell connected to selected page and storing the read data in a second latch of the page buffer; and
 descrambling data using the random seed stored in the first latch and the read data stored in the second latch to output the descrambled data, wherein the step of descrambling the data includes:
> transmitting the data stored in the second latch to a third latch of the page buffer; and
> changing data of the second latch using data stored in the first latch, changing the data of the first latch using data stored in the third latch, and changing the data of the second latch using the data stored in the first latch.

12. The method of claim 11, wherein the step of the storing the random seed in the first latch includes reading data stored in a page of a spare block corresponding to the page selected for programming and storing the read data in the first latch.

13. The method of claim 11, wherein the step of storing the random seed in the first latch includes storing the random seed generated according to an address in the first latch.

14. The method of claim 11, wherein an XOR operation is performed of the random seed stored in the first latch and the read data stored in the second latch, and result of the XOR operation is the descrambled data.

* * * * *